United States Patent [19]

Nishikawa et al.

[11] Patent Number: 4,929,533

[45] Date of Patent: May 29, 1990

[54] PROCESS FOR PRODUCING PRESENSITIZED DIAZO RESIN LITHOGRAPHIC PRINTING PLATE USING 1-METHOXY-2-PROPANOL AS COATING SOLVENT

[75] Inventors: Nobuo Nishikawa; Hiroshi Misu, both of Shizuoka, Japan

[73] Assignee: Fuji Photo Film Co., Ltd., Kanagawa, Japan

[21] Appl. No.: 214,805

[22] Filed: Jul. 1, 1988

Related U.S. Application Data

[63] Continuation of Ser. No. 896,025, Aug. 13, 1986, abandoned.

[30] Foreign Application Priority Data

Aug. 14, 1985 [JP] Japan .................. 60-178716

[51] Int. Cl.$^5$ .................. G03C 1/74; G03C 1/60
[52] U.S. Cl. .................. 430/169; 430/175; 430/177; 430/302
[58] Field of Search .............. 430/175, 169, 177, 302

[56] References Cited

U.S. PATENT DOCUMENTS

| | | | |
|---|---|---|---|
| 3,890,152 | 6/1975 | Ruckert et al. | 430/157 |
| 4,172,729 | 10/1979 | Narutomi et al. | 430/302 |
| 4,552,908 | 11/1985 | Nicks et al. | 523/504 |
| 4,576,893 | 3/1986 | Nakakita et al. | 430/302 |
| 4,657,942 | 4/1987 | Iwasaki et al. | 430/286 |
| 4,659,645 | 4/1987 | Frommeld et al. | 430/176 |
| 4,764,450 | 8/1988 | Ruckert et al. | 430/165 |

OTHER PUBLICATIONS

J. Kosar, *Light–Sensitive Systems*, Wiley & Sons, 1965, pp. 158–160, 175–180 and 321–330.
Deller's Patent Claims, Second Edition, Section 482 "Interpretation of Consisting Essentially Of", Cumulative Supplement, vol. 3, Issue 1, Aug., 1987.
Anon, "Spotlight on Glycol Ethers", *Chemical Week*, Jun. 9, 1986, p. 7.

*Primary Examiner*—Charles L. Bowers, Jr.
*Attorney, Agent, or Firm*—Sughrue, Mion, Zinn, Macpeak & Seas

[57] ABSTRACT

A process is described for producing a presensitized lithographic printing plate by coating onto a surface-roughened aluminum plate a solution having dissolved in a solvent containing at least 10 wt % 1-methoxy-2-propanol a negative-working, light-sensitive composition which contains a light-sensitive diazo resin and a high-molecular weight compound and which is developable with an aqueous alkali developer, and drying the coated solution.

13 Claims, No Drawings

PROCESS FOR PRODUCING PRESENSITIZED DIAZO RESIN LITHOGRAPHIC PRINTING PLATE USING 1-METHOXY-2-PROPANOL AS COATING SOLVENT

This is a continuation of application Ser. No. 896,025, filed 8/13/86, now abandoned.

BACKGROUND OF THE INVENTION

The present invention relates to a process for producing a presensitized lithographic printing plate. More particularly, the present invention relates to a process for producing a presensitized printing plate by coating a negative-working, light-sensitive composition with the aid of a particular solvent.

There are many known methods for producing presensitized lithographic printing plates by coating an aluminum plate with a light-sensitive composition containing a light-sensitive diazo resin and a high-molecular weight compound. See, for example, Japanese Patent Publication No. 1167/72 and Japanese Patent Application (OPI) Nos. 9804/73, 24404/72, 38302/72, 30604/75, 118802/75, and 120903/78 (the term "OPI" as used herein means an unexamined published patent application).

However, the conventional presensitized lithographic printing plates prepared by coating a solution of a light-sensitive composition onto a support having a hydrophilic surface, particularly an aluminum plate having a surface which has been rendered hydrophilic, have the disadvantage that their developability decreases with time and that the plates become soiled in non-image areas during printing.

Attempts have been made to eliminate this disadvantage by incorporating a variety of stabilizers in the light-sensitive layer. Among the stabilizers so far proposed for this purpose are the phosphorous acid described in Japanese Patent Application (OPI) No. 151023/79; the oxalic acid described in Japanese Patent Application (OPI) No. 3216/78; the halogen-containing organic phosphate ester compound described in Japanese Patent Application (OPI) No. 36207/75; the heterocyclic diazonium salt described in Japanese Patent Application (OPI) No. 143405/76; and the phosphoric acid, sulfuric acid, organic sulfonic acid, polyacrylic acid, polyvinylphosphonic acid, and polyvinylsulfonic acid as described in U.S. Pat. No. 3,679,419. These compounds have been found effective in improving the time-dependent developability of presensitized lithographic printing plates, but the results have not been completely satisfactory.

SUMMARY OF THE INVENTION

The primary object, therefore, of the present invention is to provide a process for producing a presensitized lithographic printing plate by coating and drying a negative-working, light-sensitive composition which contains a light-sensitive diazo resin and a high-molecular weight compound and which is developable with an aqueous alkali developer, said printing plate being rendered free from the problem of soiling in non-image areas during printing which presumably results from the decrease in the developability of the printing plate with time.

The present inventors have made extensive efforts to attain the aforementioned object and have now accomplished the present invention, which is directed to a process for producing a presensitized lithographic printing plate by coating onto a surface-roughened aluminum plate a solution having dissolved in a solvent containing at least 10 wt % 1-methoxy-2-propanol a negative-working, light-sensitive composition which contains a light-sensitive diazo resin and a high-molecular weight compound and which is developable with an aqueous alkali developer, and drying the coated solution.

DETAILED DESCRIPTION OF THE INVENTION

A variety of solvents may be used as coating aids when a negative working, light-sensitive composition which contains a light-sensitive diazo resin and a high-molecular weight compound and which is developable with an aqueous alkali developer is coated onto an aluminum plate. Illustrative solvents include: water, methanol, ethanol, propanol, butanol, amyl alcohol, pentanol, fusel oil, hexanol, heptanol, octanol, cyclohexanol, benzyl alcohol, furfuryl alcohol, tetrahydrofurfuryl alcohol, hexane, octane, heptane, decane, petroleum ether, petroleum benzine, ligroin, gasoline, kerosene, cyclohexane, benzene, toluene, xylene, tetralin, decalin, terpene oil, chloroform, carbon tetrachloride, ethylene chloride, ethylidene chloride, trichloroethane, tetrachloroethane, trichloroethylene, tetrachloroethylene, trichloropropane, isopropyl chloride, dichloropropane, butyl chloride, amyl chloride, hexyl chloride, ethylene bromide, tetrabromoethane, chlorobenzene, dichlorobenzene, trichlorobenzene, bromobenzene, chlorotoluene, isopropylether, dibutyl ether, diisoamyl ether, hexyl ether, methylphenyl ether, ethylphenyl ether, butylphenyl ether, ethylbenzyl ether, dioxane, 2-methylfuran, tetrahydrofuran, tetrahydropyran, cineole, acetone, methyl ethyl ketone, methyl propyl ketone, methyl butyl ketone, methyl amyl ketone, methyl hexyl ketone, diethyl ketone, ethyl butyl ketone, dipropyl ketone, diisobutyl ketone, diacetone alcohol, phorone, isophorone, cyclohexanone, methyl cyclohexanone, acetophenone, ethyl formate, propyl formate, butyl formate, amyl formate, methyl acetate, ethyl acetate, propyl acetate, butyl acetate, amyl acetate, methyl isoamyl acetate, methoxybutyl acetate, hexyl acetate, cyclohexyl acetate, benzyl acetate, methyl propionate, ethyl propionate, butyl propionate, amyl propionate, methyl butyrate, ethyl butyrate, butyl butyrate, amyl butyrate, methyl acetoacetate, ethyl acetoacetate, isoamyl isovalerate, methyl lactate, ethyl lactate, butyl lactate, amyl lactate, methyl benzoate, diethyl oxalate, ethylene glycol, ethylene glycol monomethyl ether, ethylene glycol monomethyl ether acetate, ethylene glycol monoethyl ether, ethylene glycol diethyl ether, ethylene glycol monoethyl ether acetate, ethylene glycol isopropyl ether, ethylene glycol monobutyl ether, ethylene glycol dibutyl ether, ethylene glycol monobutyl ether acetate, ethylene glycol monophenyl ether, methoxymethoxyethanol, ethylene glycol monoacetate, ethylene glycol diacetate, diethylene glycol, diethylene glycol monomethyl ether, diethylene glycol monoethyl ether, diethylene glycol monoethyl ether acetate, diethylene glycol monobutyl ether, diethylene glycol monobutyl ether acetate, diethylene glycol dimethyl ether, diethylene glycol diethyl ether, diethylene glycol acetate, propylene glycol, propylene glycol monoethyl ether, propylene glycol propyl ether, propylene glycol monobutyl ether, dipropylene glycol, dipropylene glycol monomethyl ether, dipropylene glycol monoethyl ether, trimethylene glycol, butanediol, hexylene glycol, formic acid, acetic acid, acetic anhydride, propionic acid, propionic anhydride, butyric acid, valeric acid, lactic acid, pyridine, picoline, quinoline, isoquinoline, dimethyl sulfoxide, triethyl phosphate, dimethylformamide, γ-butyrolactone, γ-valerolactone, 6-hexanolactone, methyl salicylate, ethyl salicylate, butyl salicylate, diethyl adipate, ethyl carbonate, butyl sulfide, and diacetone alcohol.

These solvents may be used either alone or in admixture. If a light-sensitive composition which contains a light-sensitive diazo resin and a high-molecular weight compound and which is developable with an aqueous alkali developer is coated onto an aluminum plate with the aid of one or more of these solvents, the resulting presensitized lithographic printing plate will normally be soiled in non-image areas during printing, presumably because its developability decreases with time. However, no such problem occurs when printing is done on a presensitized lithographic printing plate that has been prepared by coating the light-sensitive composition with the aid of 1-methoxy-2-propanol in accordance with the present invention and which has been stored for a long period of time. It was quite surprising to find that such result was obtainable by appropriate selection of coating solvents.

In accordance with the present invention, 1-methoxy-2-propanol is present in the coating solvent in a weight proportion of from 10 to 100%, preferably from 20 to 100%, most preferably from 25 to 80%. Any solvent that is selected from the foregoing list of common solvents may be mixed with 1-methoxy-2-propanol and preferable examples include methanol, butanol, ethylene chloride, chlorobenzene, tetrahydrofuran, acetone, methyl ethyl ketone, cyclohexanone, ethyl acetate, butyl acetate, ethyl lactate, ethylene glycol monomethyl ether (methyl cellosolve), ethylene glycol monoethyl ether (ethyl cellosolve), dimethylformamide, dimethyl sulfoxide, γ-butyrolactone, water and diacetone alcohol.

A surface-roughened aluminum plate suitable for use as a support in the present invention may be prepared by a variety of methods. The surface of an aluminum plate may be grained by wire brush graining, brush graining wherein the surface of the aluminum plate is roughened with a nylon brush while a slurry of abrasive grit is poured thereover, ball graining, chemical graining, electro-graining, or combined graining which employs two or more of these graining methods in combination. Thereafter, the grained aluminum surface is preferably provided with a strong passivated film which is formed by anodization with a d.c. or a.c. power supply within an electrolyte such as sulfuric acid, phosphoric acid, oxalic acid, boric acid, chromic acid, sulfamic acid, or a mixture thereof. The passivated film alone is effective for providing a hydrophilic surface for the aluminum plate, but, more preferably, it may be further subjected to one of the following treatments improving hydrophilicity: the treatment with a silicate (e.g., sodium silicate or potassium silicate) that is described in U.S. Pat. No. 2,714,066 and 3,181,461; the treatment with potassium fluorozirconate described in U.S. Pat. No. 2,946,638; the treatment with phosphomolybdate described in U.S. Pat. No. 3,201,247; the treatment with polyacrylic acid described in German Patent No. 1,091,433; the treatment with polyvinylphosphonic acid described in German Patent No. 1,134,093 and British Patent No. 1,230,447; the treatment with phosphonic acid described in Japanese Patent Publication No. 6409/69; the treatment with phytic acid described in U.S. Pat. No. 3,307,951; the combined treatment with a hydrophilic organic high-molecular weight compound and a divalent metal as described in Japanese Patent Application (OPI) Nos. 16893/83 and 18291/83; or subbing with a water-soluble polymer having a sulfonic acid group. Another treatment that may be employed to provide a hydrophilic surface is the silicate electro-deposition described in U.S. Pat. No. 3,658,662.

Examples of the light-sensitive diazo resin that may be used in the present invention are described in U.S. Pat. Nos. 3,867,147 and 2,632,703, and particularly useful diazo resins are represented by the products of condensation between aromatic diazonium salts and compounds such as, for example, active carbonyl-containing compounds (e.g., formaldehyde). Preferable diazo resins include hexafluorophosphates, tetrafluoroborates, and tetrafluorophosphates of the condensation product of p-diazodiphenylamine and formaldehyde or acetaldehyde. Other preferable example are described in U.S. Pat. No. 3,300,309 and include sulfonates (e.g., p-toluenesulfonate and 2-methoxy-4-hydroxy-5-benzoylbenzenesulfonate), phosphinates (e.g., benzenephosphinate), hydroxy-containing salts (e.g., 2,4-dihydroxybenzophenone salt), and organic carboxylates of the condensation product of p-diazodiphenylamine and formaldehyde.

Another suitable diazo resin is described in Japanese Patent Application (OPI) No. 27141/83; this resin is prepared by first condensing 3-methoxy-4-diazodiphenylamine with 4,4'-bis-methoxymethyl-diphenyl ether, then converting the condensation product to a mesitylene sulfonate salt form.

The high-molecular weight compound to be used in the present invention may be selected from among organic high-molecular weight compounds which will dissolve or swell in the aqueous alkali developer and which will harden by light illumination in the presence of the light-sensitive diazo resin.

Particularly advantageous organic high-molecular weight compounds include copolymers containing acrylic acid, methacrylic acid, crotonic acid, or maleic acid as an essential component; for example, copolymers of 2-hydroxyethyl acrylate or 2-hydroxyethyl methacrylate, acrylonitrile or methacrylonitrile, acrylic acid or methacrylic acid, and optional other copolymerizable monomers, as described in Japanese Patent Application (OPI) No. 118802/75 corresponding to U.S. Pat. No. 4,123,276; copolymers of acrylic acid or methacrylic acid which is terminated by a hydroxyl group and is esterified with a group containing a dicarboxylic acid ester redidue, acrylic acid or methacrylic acid and optional other copolymerizable monomers, as described in Japanese Patent Application (OPI) No. 120903/78; copolymers of a monomer having a terminal aromatic hydroxyl group (e.g., N-(4-hydroxyphenyl)methacrylamide), acrylic acid or methacrylic acid and optional other copolymerizable monomers, as described in Japanese Patent Application (OPI) No. 98614/79; and copolymers of an alkyl acrylate, acrylonitrile or methacrylonitrole, and an unsaturated carboxylic acid, as described in Japanese Patent Application (OPI) No. 4144/81. Acidic polyvinyl alcohol derivatives and acidic cellulosic derivatives are also useful. Also useful is the high-molecular weight compound described in British Patent No. 1,370,316 which is an alkali-soluble form of polyvinyl acetal.

Suitable proportions of the diazo resin and the high-molecular weight compound in the light-sensitive composition are such that the diazo resin is present in an amount of from 3 to 40 wt % of the total weight of the diazo resin and the high-molecular weight compound while the high-molecular weight compound is present in an amount of from 97 to 60 wt % of the total weight of the two components. Higher sensitivity is attained by reducing the content of the diazo resin. However, if the content of the diazo resin becomes lower than 3 wt %, it is insufficient to harden the high-molecular weight compound completly by light illumination, and the hardened film will be swelled by the developing solution to lose its structual integrity. If, on the other hand, the content of the diazo resin exceeds 40 wt %, the sensitivity of the composition is lowered to an impractical level. Therefore, more preferable proportions of the diazo resin and the high-molecular weight compound in the light-sensitive composition are such that the diazo resin is present in an amount of from 5 to 20 wt % while the high-molecular weight compound is present in an amount of from 95 to 80 wt % of the total weight of the diazo resin and the high-molecular weight compound. The total weight of the diazo resin and the high-molecular weight compound ranges within from 70 to 100 wt % based on the light-sensitive composition.

A variety of additives may be incorporated in the light-sensitive composition used in the present invention. Usable additives include: agents that provide improved coatability such as alkyl ethers (e.g., ethyl cellulose and methyl cellulose) and fluorine-based surfactants; plasticizers which impart flexibility or wear resistance to the coating (e.g., tricresidyl phosphate, dimethyl phthalate, dibutyl phthalate, trioctyl phosphate, tributyl phosphate, tributyl citrate, polyethylene glycol, and polypropylene glycol); colorants for rendering the developed image areas visible such as dyes (e.g., acridine, cyanine, styryl, and triphenyl-methane dyes) or pigments (e.g., phthalocyanine); and common stabilizers for diazo resins (e.g., phosphoric acid, phosphrous acid, pyrophosphoric acid, oxalic acid, boric acid, toluene-sulfonic acid, polyacrylic acid, and copolymers thereof; polyvinylphosphonic acid and copolymers thereof; polyvinylsulfonic acid and copolymers thereof; 5-nitronaphthalene-1-phosphonic acid, 4-chlorophenoxymethylphosphonic acid, sodium phenyl-methylpyrazolone sulfonate, 2-phosphonobutanetricarboxylic acid-1,2,4, 1-phosphonoethane-tricarboxylic acid-1,2,2, and 1-hydroxyethane-1,1-disulfonic acid). The amounts of these additives will vary with the specific purpose of their use, but generally, they are used in amounts of from 0.5 to 30 wt % of the total solids content in the light-sensitive layer.

In the present invention, the light-sensitive composition is generally coated onto the surface-roughened aluminum in an amount of from 0.3 to 5 g/m² on a solids basis, and preferably from 0.5 to 3.5 g/m² on a solids basis. The solids content of the solution of the light-sensitive composition that provides a coating weight in these ranges is generally from 1 to 50 wt %, and preferably from 2 to 20 wt % based on the solution of the light-sensitive composition. A solution of the light-sensitive composition may be coated onto the aluminum plate by any one of the known techniques such as roll coating, bar coating, spray coating, curtain coating, and whirl coating. The applied solution of the light-sensitive composition is preferably dried at a temperature within the range of from 50° to 120° C. Drying may be performed in two stages (i.e., pre-drying at low temperatures, followed by drying at elevated temperatures) or in one step consisting of direct drying at elevated temperatures.

The lithographic printing plate having the dry layer of light-sensitive composition on the surface-roughened aluminum plate is subjected to imagewise exposure and developed with an aqueous alkali developer to provide a relief image which is negative with respect to the original. Light sources which are suitable for use in exposure include a carbon arc lamp, a mercury lamp, a xenon lamp, a metal halide lamp, an electronic strobe flash, and an ultraviolet laser beam. The "aqueous alkali developer" used for developing the lithographic printing plate prepared in accordance with the present invention refers to one which contains an alkali agent, e.g., ttiethanolamine, monoethanolamine, etc., which have pHs in the range of from 8 to 13 and which contain at least 75 wt % water. The aqueous alkali developer may contain a small amount of an organic solvent, a surfactant, an anti-smudge agent, or a water softener as required. An illustrative aqueous alkali developer is a weak alkaline aqueous solution as described in Japanese Patent Application (OPI) Nos. 77401/76, 80228/76, 44202/78 corresponding to U.S. Pat. No. 4,186,006, and 52054/80, which is composed of an organic solvent having a water solubility of not more than 10% at room temperature (e.g., benzyl alcohol or ethylene glycol monophenyl ether), an alkali agent (e.g., triethanolamine or monoethanolamine), an anionic surfactant (e.g., an aromatic sulfonate, dialkylsulfosuccinate alkylnaphthalenesulfonate,

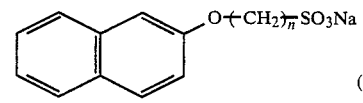

(n = 1–10),

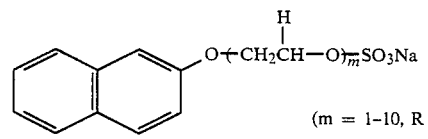

(m = 1–10, R = H or CH₃), or a branched alkyl sulfate ester), and water, with an optional anti-smudge agent (e.g., sodium sulfite or a sodium salt of sulfopyrazolone) or water softener (e.g., tetrasodium ethylenediaminetetraacetate or N(—CH₂COONa)₃).

As described in the foregoing, the present invention provides a process for producing a presensitized lithographic printing plate by coating onto a surface-roughened aluminum plate a solution having dissolved in a solvent a negative-working, light-sensitive composition which contains a light-sensitive diazo resin and a high-molecular weight compound and which is developable with an aqueous alkali developer, and by drying the coated solution, said process being characterized in that at least 10 wt % of said solvent is 1-methoxy-2-propanol. The presensitized lithographic printing plate produced by the process of the present invention is significantly improved in terms of resistance to soiling in non-image areas during printing, which is the problem presumably ascribable to the decrease in the developability of the plate with time.

The following examples are provided for the purpose of further illustrating the present invention but should in no sense be taken to limit the invention. In the examples, all percentages are by weight.

SYNTHESIS EXAMPLE 1

A hundred grams of 1-methoxy-2-propanol was heated to 100° C. under a nitrogen stream. To the heated solvent, a mixture of 2-hydroxyethyl methacrylate (23 g), acrylonitrile (27.5 g), benzyl methacrylate (43 g), methacrylic acid (6.5 g), and benzoyl peroxide (0.4 g) was added dropwise over a period of 2 hours. Fifteen minutes after completion of the addition, 100 g of 1-methoxy-2-propanol and 0.1 g of benzoyl peroxide were added and the mixture was immediately subjected to reaction for 4 hours. After completion of the reaction, the mixture was diluted with methanol and poured into water to form a copolymer precipitate which was vacuum-dried at 70° C. The dried 2-hydroxyethyl methacrylate copolymer had an acid value of 40.

SYNTHESIS EXAMPLE 2

By repeating the procedures of Synthesis Example 1, a copolymer of 2-hydroxyethyl methacrylate/acrylonitrile/ethyl methacrylate/methacrylic acid (monomer feed ratio=50/20/25/5 wt %) was obtained. This copolymer had an acid value of 31.

SYNTHESIS EXAMPLE 3

By repeating the procedures of Synthesis Example 1, a copolymer of p-hydroxyphenyl methacrylamide/acrylonitrile/ethyl acrylate/methacrylic acid (monomer feed ratio =20/35/37/8 wt %) was obtained. This copolymer had an acid value of 51.

EXAMPLE 1

A 2S aluminum plate 0.24 mm thick was degreased by being immersed in a 10% aqueous solution of tertiary sodium phosphate (80° C.) for 3 minutes. The surface of the aluminum plate was roughened by brush graining and desmutted with a 3% aqueous solution of sodium aluminate at 60° C. The aluminum plate was then anodized in 20% $H_2SO_4$ for 2 minutes at a current density of 2 amps/$dm^2$. The anodized plate was treated in a 3% aqueous solution of potassium silicate (70° C.) for 1 minute.

The thus prepared aluminum support was whirl-coated with the following solution of light-sensitive composition (I), which then was dried at 100° C. for 2 minutes. The coating weight of the solution was adjusted to become 1.5±0.1 g/$m^2$ on a dry solids basis.

| Solution of light-sensitive composition (I): | |
|---|---|
| Copolymer prepared in Synthesis Example 1 | 5.0 g |
| Diazo resin (1) | 0.5 g |
| Victoria Pure Blue BOH | 0.15 g |
| Sodium t-butylnaphthalenesulfonate | 0.15 g |
| Phosphorous acid | 0.1 g |
| Water | 5.0 g |
| Solvent (see Table 1) | 100.0 g |

Diazo resin (1) was prepared by the following method: p-diazodiphenylamine was condensed with paraformaldehyde; an aqueous solution of $NaPF_6$ was added to an aqueous solution of a sulfate salt of the condensation product; the resulting precipitate was recovered and dried. This diazo resin had a $PF_6$ substitution ratio of 89 mol %.

The presensitized lithographic printing plate thus prepared was left to stand for 5 days at 45° C. and at a relative humidity of 75%. Thereafter, the plate was subjected to imagewise exposure using 2 KW metal halide lamp as a light source, at a distance of 1 m from the light source for 1 minute, and vat development at 25° C. for 60 seconds with a liquid developer composed of benzyl alcohol (30 g), triethanolamine (10 g), sodium isopropylnaphthalenesulfonate (10 g), sodium sulfite (2 g), sodium nitrilotriacetate (0.5 g), and tap water (950 g). The developed plate was washed with water and coated with a protective film made of gum arabic. The thus prepared plate was set in a printing press and lithographic printing was performed to see if any part of the non-image areas would become soiled.

The same experiment was conducted with the solvent for the application of a solution of light-sensitive composition being changed as shown in Table 1. The test results with respect to the soiling of non-image areas during lithographic printing are shown in Table 1, from which it can be seen that the presensitized lithographic printing plates prepared in accordance with the present invention have improved resistance to the soiling of non-image areas during printing.

TABLE 1

Soiling of Non-Image Areas during Printing with Presensitized Lithographic Printing Plates Which Were Left to Stand for 5 Days at 45° C. and 75% RH

| Run No. | Coating Solvent | | Soiling |
|---|---|---|---|
| 1 | 1-methoxy-2-propanol | 80% | negative |
|  | methanol | 20% |  |
| 2 | 1-methoxy-2-propanol | 80% | negative |
|  | ethylene chloride | 20% |  |
| 3 | 1-methoxy-2-propanol | 60% | negative |
|  | tetrahydrofuran | 40% |  |
| 4 | 1-methoxy-2-propanol | 60% | negative |
|  | methyl ethyl ketone | 40% |  |
| 5 | 1-methoxy-2-propanol | 70% | negative |
|  | cyclohexane | 30% |  |
| 6 | 1-methoxy-2-propanol | 80% | negative |
|  | butyl acetate | 20% |  |
| 7 | 1-methoxy-2-propanol | 40% | negative |
|  | ethyl lactate | 60% |  |
| 8 | 1-methoxy-2-propanol | 90% | negative |
|  | dimethyl sulfoxide | 10% |  |
| 9 | 1-methoxy-2-propanol | 40% | negative |
|  | methanol | 20% |  |
|  | methyl ethyl ketone | 40% |  |
| 10 | 1-methoxy-2-propanol | 30% | negative |
|  | water | 10% |  |
|  | methyl ethyl ketone | 55% |  |
|  | dimethylformamide | 5% |  |
| Comparative sample 1 | ethyl cellosolve | 80% | positive |
|  | methanol | 20% |  |
| Comparative sample 2 | ethyl cellosolve | 80% | slightly positive |
|  | ethylene chloride | 20% |  |
| Comparative sample 3 | diacetone alcohol | 60% | positive |
|  | methyl ethyl ketone | 40% |  |
| Comparative sample 4 | cyclohexanone | 60% | positive |
|  | methyl ethyl ketone | 40% |  |
| Comparative sample 5 | methyl cellosolve | 40% | slightly positive |
|  | methanol | 20% |  |
|  | methyl ethyl ketone | 40% |  |

EXAMPLE 2

An aluminum support which was surface-treated as in Example 1 was coated with the following solution of light-sensitive composition (2) and dried as in Example 1.

| Solution of light-sensitive composition (2): | |
| --- | --- |
| Copolymer prepared in Synthesis Example 2 | 5.0 g |
| Diazo resin (2) | 0.5 g |
| Victoria Pure Blue BOH | 0.15 g |
| Sodium t-butylnaphthalenesulfonate | 0.15 g |
| Phosphorous acid | 0.1 g |
| Solvent (see Table 2) | 100.0 g |

Diazo resin (2) was synthesized from the condensation product of p-diazodiphenylamine and paraformaldehyde and from 2-methoxy-4-hydroxy-5-benzoylbenzene-sulfonic acid.

The presensitized lithographic printing plates thus prepared was left to stand for 5 days at 45° C. and at a relative humidity of 75%. Thereafter, the plate was subjected to imagewise exposure, developed, washed with water, and coated with a protective gum layer. Printing was done on the thus prepared plate to see if any part of the non-image areas would become soiled. The results are shown in Table 2.

TABLE 2

Soiling of Non-Image Areas during Printing with Presensitized Lithographic Printing Plates after Standing for 5 Days at 45° C. and 75% RH

| Run No. | Coating Solvent | | Soiling |
| --- | --- | --- | --- |
| 11 | 1-methoxy-2-propanol | 80% | negative |
|  | ethylene chloride | 20% |  |
| 12 | 1-methoxy-2-propanol | 60% | negative |
|  | tetrahydrofuran | 40% |  |
| 13 | 1-methoxy-2-propanol | 60% | negative |
|  | methyl ethyl ketone | 40% |  |
| 14 | 1-methoxy-2-propanol | 70% | negative |
|  | cyclohexanone | 30% |  |
| 15 | 1-methoxy-2-propanol | 90% | negative |
|  | dimethyl sulfoxide | 10% |  |
| 16 | 1-methoxy-2-propanol | 40% | negative |
|  | methanol | 20% |  |
|  | methyl ethyl ketone | 40% |  |
| 17 | 1-methoxy-2-propanol | 30% | negative |
|  | water | 10% |  |
|  | methyl ethyl ketone | 55% |  |
|  | dimethylformamide | 5% |  |
| 18 | 1-methoxy-2-propanol | 40% | negative |
|  | γ-butyrolactone | 40% |  |
|  | ethyl acetate | 20% |  |
| Comparative sample 6 | ethyl cellosolve | 80% | slightly positive |
|  | ethylene chloride | 20% |  |
| Comparative sample 7 | ethyl cellosolve | 60% | positive |
|  | methyl ethyl ketone | 40% |  |
| Comparative sample 8 | γ-butyrolactone | 40% | positive |
|  | methanol | 20% |  |
|  | methyl ethyl ketone | 40% |  |

EXAMPLES 3 TO 6

Presensitized lithographic plates were prepared in the same manner as in Example 1. After they were left to stand for 5 days at 45° C. and at a relative humidity of 75%, the plates were subjected to imagewise exposure, developed, washed with water, and provided with a protective gum coat. Printing was performed with the thus processed plates to see if any part of the non-image areas would become soiled. The results are shown in Table 3.

TABLE 3

Soiling of Non-Image Areas during Printing Plates after Standing for 5 Days at 45° C. and 75% RH

| Run No. | Diazo Resin | High-Molecular Weight Compound | Coating Solvent | | Soiling |
| --- | --- | --- | --- | --- | --- |
| Example 3 | diazo resin (1) | copolymer prepared in Synthesis Ex. 2 | 1-methoxy-2-propanol methyl ethyl ketone | 60% 40% | negative |
| Example 4 | diazo resin (1) | copolymer prepared in Synthesis Ex. 2 | 1-methoxy-2-propanol dimethylformamide | 80% 20% | negative |
| Example 5 | diazo resin (1) | copolymer prepared in Synthesis Ex. 3 | 1-methoxy-2-propanol methyl ethyl ketone | 60% 40% | negative |
| Example 6 | diazo resin (2) | copolymer prepared in Synthesis Ex. 1 | 1-methoxy-2-propanol water methyl ethyl ketone | 50% 10% 40% | negative |
| Comparative sample 9 | diazo resin (1) | copolymer prepared in Synthesis Ex. 2 | diacetone alcohol methyl ethyl ketone | 60% 40% | positive |
| Comparative sample 10 | diazo resin (1) | copolymer prepared in Synthesis Ex. 3 | ethyl cellosolve methyl ethyl ketone | 60% 40% | positive |

As is apparent from the results shown in Tables 2 and 3, the presensitized lithographic printing plate of the present invention provides an extraordinarily superior effect of no soiling in non-image areas during printing, regardless of kinds of used light-sensitive diazo resins and high-molecular weight compounds.

While the invention has been described in detail and with reference to specific embodiments thereof, it will be apparent to one skilled in the art that various changes and modifications can be made therein without departing from the spirit and scope thereof.

What is claimed is:

1. A process for producing a presensitized lithographic printing plate by coating onto a surface-roughened aluminum plate a solution having dissolved in a solvent containing at least 10 wt % of 1-methoxy-2-propanol a negative working, light-sensitive composition consisting of a light-sensitive diazo resin in an amount sufficient to harden the composition by light illumination, a high-molecular weight copolymer which will dissolve or swell in an aqueous alkali developer in an amount from 97 to 60 wt % of the total weight of the diazo resin and the high-molecular weight copolymer which will dissolve or swell in an aqueous alkali developer and from 0 to 30 wt % based on the total weight of the composition of an additive selected from the group consisting of coatability improving agents, plasticizers which impart flexibility or wear resistance to the light-sensitive composition, colorants, and stabilizers for the diazo resin, and which composition becomes insolubilized or less-swellable in the aqueous alkali developer upon light illumination and development with the aqueous alkali developer, and drying the coated solution wherein the 1-methoxy-2-propanol is present in sufficient amount during coating to provide resistance to soiling in non-image areas during printing of the lithographic printing plate.

2. A process for producing a presensitized lithographic plate as in claim 1, wherein the coatability improving agents are fluorine-based surfactants.

3. A process for producing a presensitized lithographic printing plate as in claim 1, wherein the solvent contains from 25 to 80 wt % 1-methoxy-2-propanol.

4. A process for producing a presensitized lithographic printing plate as in claim 1, wherein the solution containing the light-sensitive composition is coated onto the aluminum plate so as to provide a coating of from 0.5 to 3.5 g/m$^2$ on a solids basis.

5. A process for producing a presensitized lithographic printing plate as in claim 1, wherein the solids content of the solution of the light-sensitive composition is from 1 to 50 wt % based on the solution of the light-sensitive composition.

6. A process for producing a presensitized lithographic printing plate as in claim 1, wherein the diazo resin is used in an amount of from 3 to 40 wt % and the high-molecular weight compound is used in an amount of from 97 to 60 wt % of the total weight of the diazo resin and the high-molecular weight compound.

7. A process for producing a presensitized lithographic printing plate as in claim 1, wherein the solvent further contains at least one solvent selected from the group consisting of water, methanol, ethanol, propanol, butanol, amyl alcohol, pentanol, fusel oil, hexanol, heptanol, octanol, cyclohexanol, benzyl alcohol, furfuryl alcohol, tetrahydrofurfuryl alcohol, hexane, heptane, octane, decane, petroleum ether, petroleum benzine, ligroin, gasoline, kerosene, cyclohexane, benzene, toluene, xylene, tetralin, decalin, terpene oil, chloroform, carbon tetrachloride, ethylene chloride, ethylidene chloride, trichloroethane, tetrachloroethane, trichloroethylene, tetrachloroethylene, trichloropropane, isopropyl chloride, dichloropropane, butyl chloride, amyl chloride, hexyl chloride, ethylene bromide, tetrabromoethane, chlorobenzene, dichlorobenzene, trichlorobenzene, bromobenzene, chlorotoluene, isopropylether, dibutyl ether, diisoamyl ether, hexyl ether, methylphenyl ether, ethylphenyl ether, butylphenyl ether, ethylbenzyl ether, dioxane, 2-methylfuran, tetrahydrofuran, tetrahydropyran, cineole, acetone, methyl ethyl ketone, methyl propyl ketone, methyl butyl ketone, methyl amyl ketone, methyl hexyl ketone, diethyl ketone, ethyl butyl ketone, dipropyl ketone, diisobutyl ketone, diacetone alcohol, phorone, isophorone, cyclohexanone, methyl cyclohexanone, acetophenone, ethyl formate, propyl formate, butyl formate, amyl formate, methyl acetate, ethyl acetate, propyl acetate, butyl acetate, amyl acetate, methyl isoamyl acetate, methoxybutyl acetate, hexyl acetate, cyclohexyl acetate, benzyl acetate, methyl propionate, ethyl propionate, butyl propionate, amyl propionate, methyl butyrate, ethyl butyrate, butyl butyrate, amyl butyrate, methyl acetoacetate, ethyl acetoacetate, isoamyl isovalerate, methyl lactate, ethyl lactate, butyl lactate, amyl lactate, methyl benzoate, diethyl oxalate, ethylene glycol, ethylene glycol monomethyl ether, ethylene glycol monomethyl ether acetate, ethylene glycol monoethyl ether, ethylene glycol diethyl ether, ethylene glycol monoethyl ether acetate, ethylene glycol isopropyl ether, ethylene glycol monobutyl ether, ethylene glycol dibutyl ether, ethylene glycol monobutyl ether acetate, ethylene glycol monophenyl ether, methoxymethoxyethanol, ethylene glycol monoacetate, ethylene glycol diacetate, diethylene glycol, diethylene glycol monomethyl ether, diethylene glycol monoethyl ether, diethylene glycol monoethyl ether acetate, diethylene glycol monobutyl ether, diethylene glycol monobutyl ether acetate, diethylene glycol dimethyl ether, diethylene glycol diethyl ether, diethylene glycol acetate, propylene glycol, propylene glycol monoethyl ether, propylene glycol propyl ether, propylene glycol monobutyl ether, dipropylene glycol, dipropylene glycol monomethyl ether, dipropylene glycol monoethyl ether, trimethylene glycol, butanediol, hexylene glycol, formic acid, acetic acid, acetic anhydride, propionic acid, propionic anhydride, butyric acid, valeric acid, lactic acid, pyridine, picoline, quinoline, isoquinoline, dimethyl sulfoxide, triethyl phosphate, dimethylformamide, γ-butyrolactone, γ-valerolactone, 6-hexanolactone, methyl salicylate, ethyl salicylate, butyl salicylate, diethyl adipate, ethyl carbonate, butyl sulfide, and diacetone alcohol.

8. A process for producing a presensitized lithographic printing plate as in claim 3, wherein the solvent further comprises at least one selected from the group consisting of methanol, butanol, ethylene chloride, chlorobenzene, tetrahydrofuran, acetone, methyl ethyl ketone, cyclohexanone, ethyl acetate, butyl acetate, ethyl lactate, ethylene glycol monomethyl ether (methyl cellosolve), ethylene glycol monoethyl ether (ethyl cellosolve), dimethylformamide, dimethyl sulfoxide, τbutyrolactone, water, and diacetone alcohol.

9. A process for producing a presensitized lithographic printing plate as claimed in claim 1, wherein the solvent further comprises ethyl lactate.

10. A process for producing a presensitized lithographic printing plate as in claim 1, wherein the light-sensitive diazo resin is a hexafluorophosphate of a condensate of p-diazo-diphenylamine and formaldehyde.

11. A process for producing a presensitized lithographic printing plate as in claim 1, wherein the high-molecular weight compound is a copolymer of (i) 2-hydroxyethyl acrylate or 2-hydroxyethyl methacrylate, (ii) acrylonitrile or methacrylonitrile, (iii) acrylic acid or methacrylic acid and (iv) another copolymerizable monomer, or a copolymer of (a) a monomer having a terminal aromatic hydroxyl group, (b) an acrylic acid or methacrylic acid and (c) an ether copolymerizable monomer.

12. A process for producing a presensitized lithographic printing plate as in claim 1, wherein the solvent further contains at least one solvent selected from the group consisting of cyclohexanone, methanol, ethylene chloride, tetrahydro furan, methyl ethyl ketone, butyl acetate, ethyl acetate, ethyl lactate, dimethyl sulfoxide, dimethyl formamide and water.

13. A process for producing a presensitized lithographic printing plate as in claim 1, wherein the solvent contains from 25 to 100 wt % 1-methoxy-2-propanol.

* * * * *